US012646469B2

(12) United States Patent
Zheng et al.

(10) Patent No.: US 12,646,469 B2
(45) Date of Patent: Jun. 2, 2026

(54) DISPLAY GATE DRIVER CIRCUITRY WITH REDUCED POWER CONSUMPTION AND SMALLER FOOTPRINT

(71) Applicant: Apple Inc., Cupertino, CA (US)

(72) Inventors: Dongqi Zheng, San Diego, CA (US);
Chin-Wei Lin, San Jose, CA (US);
Szu-Hsien Lee, Los Gatos, CA (US);
Shinya Ono, Santa Clara, CA (US);
Gihoon Choo, San Jose, CA (US);
Gunhee Kim, Santa Clara, CA (US);
Tsung-Ting Tsai, San Jose, CA (US);
Pei-En Chang, San Jose, CA (US);
Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 19/200,452

(22) Filed: May 6, 2025

(65) Prior Publication Data

US 2026/0024499 A1    Jan. 22, 2026

Related U.S. Application Data

(60) Provisional application No. 63/673,545, filed on Jul. 19, 2024.

(51) Int. Cl.
*G09G 3/3266* (2016.01)
*G09G 3/3233* (2016.01)
(Continued)

(52) U.S. Cl.
CPC ........... *G09G 3/3266* (2013.01); *H03K 3/037* (2013.01); *H03K 17/6872* (2013.01);
(Continued)

(58) Field of Classification Search
CPC ............... G09G 3/3266; G09G 3/3233; G09G 2300/0823; G09G 2300/0842;
(Continued)

(56) References Cited

U.S. PATENT DOCUMENTS 8,724,406 B2    5/2014    Tseng et al.
9,589,523 B2    3/2017    Xiao
(Continued)

FOREIGN PATENT DOCUMENTS

KR          101816305 B1      1/2018
WO          2022150630 A1     7/2022

*Primary Examiner* — Mark Edwards
(74) *Attorney, Agent, or Firm* — Treyz Law Group; Jason Tsai

(57) ABSTRACT

A display may include an array of pixels that receive control signals from a chain of gate drivers. Each gate driver may include a first complementary inverter configured to receive a carry in signal, a second complementary inverter having an input coupled to the first complementary inverter and having an output at which a carry out signal is produced, and an output buffer subcircuit coupled to the input of the second complementary inverter. The output buffer subcircuit can include a first output buffer transistor coupled in series with a second output buffer transistor. The first complementary inverter can receive the carry in signal through a transmission gate that is controlled by two shift register clock signals.

18 Claims, 8 Drawing Sheets

(51) Int. Cl.
| | |
|---|---|
| *G11C 19/28* | (2006.01) |
| *H03K 3/037* | (2006.01) |
| *H03K 17/687* | (2006.01) |

(52) U.S. Cl.
CPC ... *G09G 3/3233* (2013.01); *G09G 2300/0823* (2013.01); *G09G 2300/0842* (2013.01); *G09G 2300/0861* (2013.01); *G09G 2310/0254* (2013.01); *G09G 2310/0286* (2013.01); *G09G 2320/0247* (2013.01); *G09G 2330/023* (2013.01); *G11C 19/28* (2013.01)

(58) Field of Classification Search
CPC ... G09G 2300/0861; G09G 2310/0254; G09G 2310/0286; G09G 2320/0247; G09G 2330/023; H03K 3/037; H03K 17/6872; G11C 19/28
USPC .......................................................... 345/208
See application file for complete search history.

(56) References Cited

U.S. PATENT DOCUMENTS

| | | | |
|---|---|---|---|
| 10,042,110 | B2 | 8/2018 | Park |
| 10,916,214 | B2 | 2/2021 | Huang |
| 10,998,446 | B2 | 5/2021 | Feng et al. |
| 11,062,787 | B2 | 7/2021 | Zhang et al. |
| 11,187,902 | B2 | 11/2021 | Urness et al. |
| 11,487,061 | B2 | 11/2022 | Bhargava et al. |
| 2006/0071923 | A1 | 4/2006 | Lee et al. |
| 2006/0139293 | A1 | 6/2006 | Cho |
| 2012/0213323 | A1 | 8/2012 | Tsai |
| 2015/0036784 | A1 | 2/2015 | Qing et al. |
| 2015/0054799 | A1 | 2/2015 | Chang et al. |
| 2015/0303925 | A1 | 10/2015 | Qi et al. |
| 2016/0307535 | A1 | 10/2016 | Xiao |
| 2017/0032733 | A1 | 2/2017 | Jang |
| 2018/0144688 | A1* | 5/2018 | Lee ..................... G09G 3/3266 |
| 2019/0057638 | A1 | 2/2019 | Kim et al. |
| 2019/0204968 | A1 | 7/2019 | Hur et al. |
| 2019/0219777 | A1 | 7/2019 | Yakabe et al. |
| 2020/0074937 | A1 | 3/2020 | Choi |
| 2020/0192101 | A1 | 6/2020 | Ayres et al. |
| 2020/0219576 | A1 | 7/2020 | Yao et al. |
| 2020/0341280 | A1 | 10/2020 | Bablumyan et al. |
| 2020/0357479 | A1 | 11/2020 | Tao et al. |
| 2021/0118375 | A1 | 4/2021 | Yang et al. |
| 2021/0384276 | A1* | 12/2021 | Imai ..................... G09G 3/3233 |
| 2022/0283371 | A1 | 9/2022 | Tekolste et al. |
| 2022/0334396 | A1 | 10/2022 | Alexeev et al. |
| 2022/0366855 | A1 | 11/2022 | Chang |
| 2023/0014107 | A1 | 1/2023 | Kitsomboonloha et al. |
| 2023/0036780 | A1* | 2/2023 | Lu ........................ G09G 3/3655 |
| 2023/0105266 | A1 | 4/2023 | Hong |
| 2023/0125324 | A1* | 4/2023 | Sato ..................... H10D 86/471 |
| | | | 345/55 |
| 2023/0352110 | A1 | 11/2023 | Wang et al. |
| 2024/0386838 | A1* | 11/2024 | Oh ........................ G09G 3/2096 |
| 2025/0014497 | A1* | 1/2025 | Kim ..................... G09G 3/2092 |
| 2025/0087131 | A1* | 3/2025 | Li ........................ G09G 3/3677 |
| 2025/0087169 | A1* | 3/2025 | Lee ..................... G11C 19/184 |

* cited by examiner

DISPLAY GATE DRIVER CIRCUITRY WITH REDUCED POWER CONSUMPTION AND SMALLER FOOTPRINT

This application claims the benefit of U.S. Provisional Patent Application No. 63/673,545, filed Jul. 19, 2024, which is hereby incorporated by reference herein in its entirety.

FIELD

This relates generally to electronic devices and, more particularly, to electronic devices with displays.

BACKGROUND

Electronic devices can include displays. For example, cellular telephones, tablets, wrist-watches, and portable computers often include displays for presenting image content to users. Displays such as organic light-emitting diode (OLED) displays have an array of display pixels based on light-emitting diodes. In this type of display, gate driver circuitry can be used to provide control signals to respective rows in the array of display pixels. It can be challenging to design the gate driver circuitry.

SUMMARY

An electronic device may include a display having an array of display pixels. The display pixels may be organic light-emitting diode display pixels. Each display pixel may include at least an organic light-emitting diode (OLED) that emits light and associated semiconducting oxide transistors. The array of display pixels may receive control signals such as gate output signals from peripheral gate driver circuitry. The gate driver circuitry may include a chain of gate driver circuits.

An aspect of the disclosure provides a gate driver circuit that includes a first complementary inverter configured to receive a carry in signal, a second complementary inverter having an input coupled to the first complementary inverter and having an output at which a carry out signal is produced, and an output buffer subcircuit coupled to the input of the second complementary inverter and configured to produce a gate output signal that is conveyed to a plurality of corresponding display pixels. The output buffer subcircuit can include a first output buffer transistor coupled in series with a second output buffer transistor.

An aspect of the disclosure provides gate driver circuitry that includes a first gate driver circuit having: a first clock terminal configured to receive a first shift register clock signal, a second clock terminal configured to receive a second shift register clock signal different than the first shift register clock signal, and a third clock terminal configured to receive a first output buffer clock signal; and a second gate driver circuit having a first clock terminal configured to receive the second shift register clock signal, a second clock terminal configured to receive the first shift register clock signal, and a third clock terminal configured to receive a second output buffer clock signal different than the first output buffer clock signal. The gate driver circuitry can further include: a third gate driver circuit having a first clock terminal configured to receive the first shift register clock signal, a second clock terminal configured to receive the second shift register clock signal, and a third clock terminal configured to receive the first output buffer clock signal; and a fourth gate driver circuit having a first clock terminal configured to receive the second shift register clock signal, a second clock terminal configured to receive the first shift register clock signal, and a third clock terminal configured to receive the second output buffer clock signal.

An aspect of the disclosure provides a gate driver circuit that includes: a first p-type silicon transistor having a source-drain terminal configured to receive an output buffer clock signal; a second semiconducting oxide transistor coupled in series with the first p-type silicon transistor; a third p-type silicon transistor having a first source-drain terminal coupled to a gate terminal of the first p-type silicon transistor and having a second source-drain terminal coupled to a gate terminal of the second semiconducting oxide transistor; a fourth p-type silicon transistor having a source terminal coupled to a first power supply line, a drain terminal on which a carry out signal is produced, and a gate terminal coupled to the second source-drain terminal of the third p-type silicon transistor; a fifth semiconducting oxide transistor having a drain terminal coupled to the drain terminal of the fourth p-type silicon transistor, a source terminal coupled to a second power supply line, and a gate terminal shorted to the gate terminal of the fourth p-type silicon transistor; a sixth p-type silicon transistor having a source terminal coupled to the first power supply line, a drain terminal coupled to the gate terminal of the fourth p-type silicon transistor, and a gate terminal; a seventh semiconducting oxide transistor having a drain terminal coupled to the drain terminal of the sixth p-type silicon transistor, a source terminal coupled to the second power supply line, and a gate terminal coupled to the gate terminal of the sixth p-type silicon transistor; an eighth semiconducting oxide transistor having a first source-drain terminal coupled to the gate terminal of the sixth p-type silicon transistor, a second source-drain terminal configured to receive a carry in signal, and a gate terminal configured to receive a first shift register clock signal; and a ninth p-type silicon transistor having a first source-drain terminal coupled to the gate terminal of the sixth p-type silicon transistor, a second source-drain terminal configured to receive the carry in signal, and a gate terminal configured to receive a second shift register clock signal different than the first shift register clock signal.

DETAILED DESCRIPTION

Figure 1:
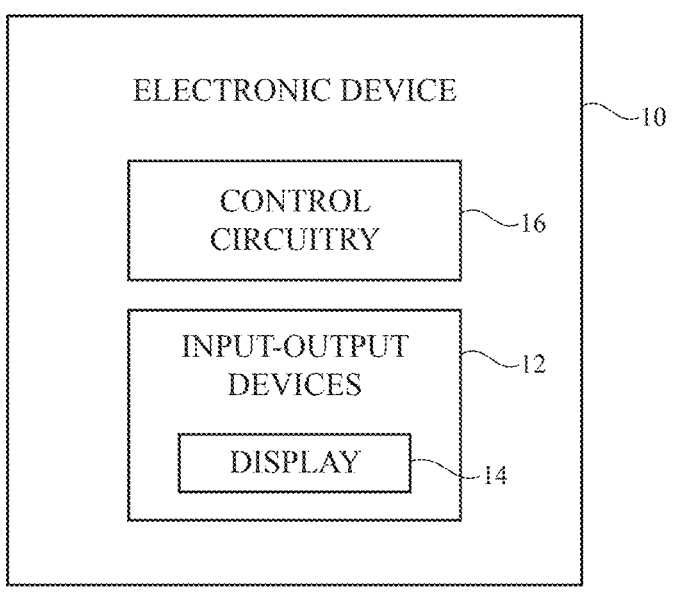
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12. Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device. Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired. Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
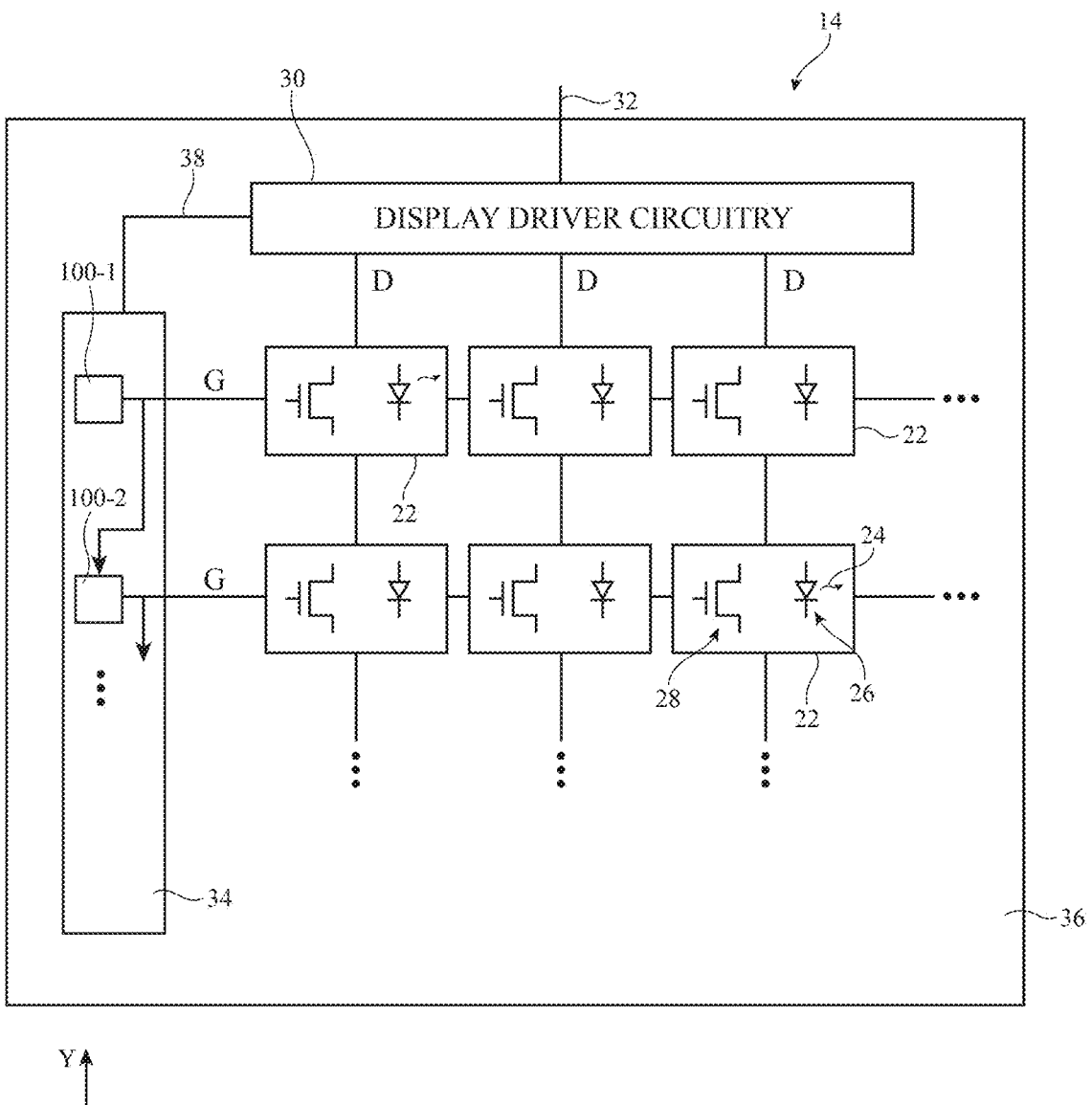
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.). Gate driver circuitry 34 may include multiple gate driver circuits (e.g., gate drivers 100-1, 100-2, and so on) connected in a chain. For example, each gate driver may be configured to generate one or more scan signals and/or carry signals that are fed forward to a succeeding gate driver in the chain and/or that are fed back to a preceding gate driver in the chain.

In accordance with some embodiments, pixels 22 and gate driver circuitry 34 may be implemented using thin-film transistors such as semiconducting oxide transistors. A "semiconducting oxide transistor" can refer to and be defined herein as a thin-film transistor having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material). Semiconducting oxide transistors are generally considered n-type (n-channel) transistors.

A semiconducting oxide transistor is notably different than a silicon transistor. A "silicon transistor" can refer to and be defined herein as a thin-film transistor having a polysilicon channel region deposited using a low temperature process sometimes referred to as LTPS or low-temperature polysilicon. Semiconducting oxide transistors exhibit lower leakage than silicon transistors, so implementing at least some of the transistors within pixel 22 can help reduce flicker (e.g., by preventing current from leaking away from the gate terminal of drive transistor Tdrive). In some embodiments, pixels 22 and gate driver circuitry 34 may be formed using only semiconducting oxide transistors (i.e., display 14 does not include any silicon transistors). In other embodiments, at least some of the transistors within pixel 22 and/or gate driver circuitry 34 may be implemented as silicon transistors such that pixel 22 and/or gate driver circuitry 34 includes a combination of semiconducting oxide transistors and silicon transistors (e.g., n-type LTPS transistors or p-type LTPS transistors).

Different transistors within display 14 may require different device characteristics for optimal display performance and operation. For instance, transistors that are predominantly in the off state may require more negative-bias-temperature-stress (NBTS) stability. As another example, transistors that are predominantly in the on state may require more positive-bias-temperature-stress (PBTS) stability. At least some transistors within gate driver circuitry 34 may benefit from better PBTS and higher mobility for enhance drive-ability.

Figure 3:
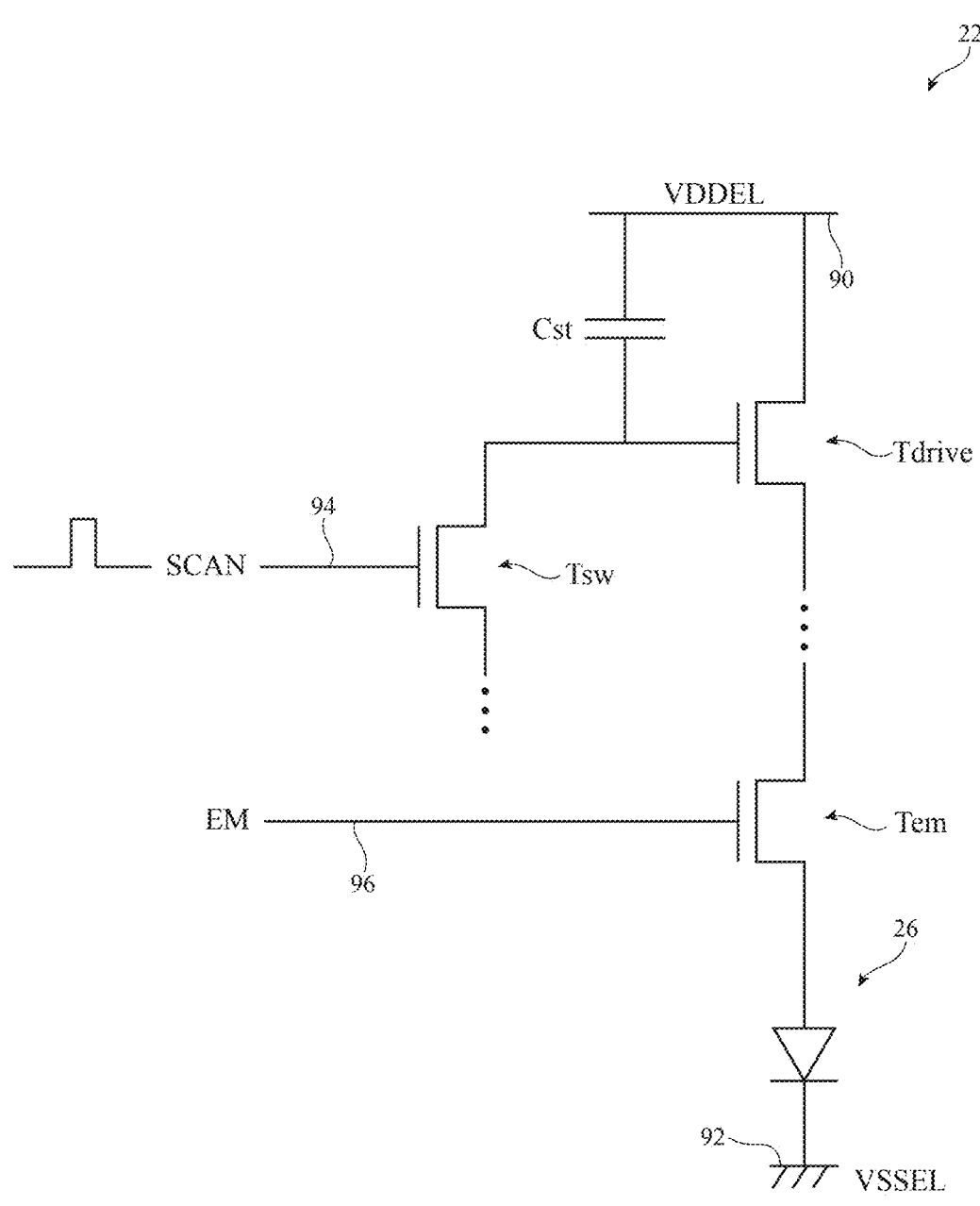
FIG. 3 is a circuit diagram of an illustrative display pixel in accordance with some embodiments.

FIG. 3 is a circuit diagram of an illustrative display pixel such as organic light-emitting diode (OLED) pixel 22 in display 14. As shown in FIG. 3, display pixel 22 may include an organic light-emitting diode 26, a storage capacitor Cst, and associated pixel transistors such as a drive transistor Tdrive, a switching transistor Tsw, and an emission transistor Tem. Any number of these transistors may be implemented as a semiconducting-oxide transistor (e.g., a transistor with an n-type channel formed from semiconducting oxide such as indium gallium zinc oxide or IGZO) or as a silicon transistor (e.g., a transistor with a polysilicon channel deposited using a low temperature process, sometimes referred to as "LTPS" or low-temperature polysilicon transistor). In particular, switching transistor Tsw may be implemented as a semiconducting-oxide transistor (sometimes referred to as an "oxide transistor"). Semiconducting-oxide transistors exhibit relatively lower leakage than silicon transistors, so implementing switching transistor Tsw as a semiconducting-oxide transistor will help reduce flicker (e.g., by preventing current from leaking away from the gate terminal of the drive transistor Tdrive). Alternatively, switching transistor can be implemented as a silicon transistor (e.g., an n-type LTPS transistor).

In the example of FIG. 3, the drive transistor Tdrive, emission transistor Tem, and diode 26 may be coupled in series between power supply terminals 90 and 92. A positive power supply voltage VDDEL may be supplied to positive power supply terminal 90, whereas a ground power supply voltage VSSEL may be supplied to ground power supply terminal 92. Positive power supply voltage VDDEL may be 3 V, 4 V, 5 V, 6 V, 7 V, 2 to 8 V, more than 10 V, or any suitable positive power supply voltage level. Ground power supply voltage VSSEL may be 0 V, −1 V, −2 V, −3 V, −4 V, −5 V, −6 V, −7 V, less than −10 V, or any suitable ground or negative power supply voltage level. The state of drive transistor Tdrive controls the amount of current flowing from terminal 90 to terminal 92 through diode 26 and therefore controls the amount of light emitted from display pixel 22.

Control signals from display driver circuitry such as row driver circuitry 34 of FIG. 2 are supplied to control terminals such as row control terminals 94 and 96. Row control terminal 96 may serve as an emission control terminal (sometimes referred to as an emission line or emission control line), whereas row control terminal 94 may serve as a scan control terminal (sometimes referred to as a scan line or scan control line). Emission control signal EM, sometimes referred to as an emission signal, may be supplied to terminal 96. Emission signal EM can be asserted to turn on transistor Tem during an emission phase to allow current to flow from the drive transistor Tdrive down to light-emitting diode 26. Scan control signal SCAN may be applied to scan line 94. Asserting signal SCAN may turn on transistor Tsw, which connects the gate and drain terminals of transistor Tdrive. Deasserting signal SCAN will turn off transistor Tsw, which decouples the gate and drain terminals of transistor Tdrive. During a data loading phase, a data signal (voltage) can be loaded onto the storage capacitor Cst (e.g., using a separate data loading transistor, not shown). Image data that is loaded into pixel 22 can be at least partially stored on pixel 22 using capacitor Cst to hold charge throughout the emission phase.

The pixel structure of FIG. 3 is illustrative and not intended to limit the scope of the present embodiments. If desired, pixel 22 may include more or less than three thin-film transistors (e.g., including one or more additional emission transistor, initialization transistor, data loading transistor, anode reset transistor, bias transistor, etc.) and/or may include more or less than one capacitor. In accordance with an embodiment, transistor Tsw can represent a data loading transistor (e.g., a transistor that is selectively activated to load a new data signal into display pixel 22). Although transistor Tsw is shown in FIG. 3 as being coupled to the gate terminal of drive transistor Tdrive, data loading (programming) transistor Tsw can alternatively be coupled to a source terminal or a drain terminal of transistor Tdrive. Device configurations in which drive transistor Tdrive is implemented as an n-type drive transistor (e.g., a semiconducting oxide drive transistor or an n-type silicon transistor) are sometimes described herein as an example.

The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal). The term "activate" with respect to a switch (or transistor) may refer to or be defined herein as an action that places the switch in an "on" or low-impedance state such that the two terminals of the switch are electrically connected to conduct current. Activating a switch can sometimes be referred to as turning on or closing a switch. The term "deactivate" with respect to a switch (or transistor) may refer to or be defined herein as an action that places the switch in an "off" or high-impedance state such that the two terminals of the switch/transistor are electrically disconnected with minimal leakage current. Deactivating a switch can sometimes be referred to as turning off or opening a switch.

Transistors within display pixel 22 can be controlled by gate output signals generated by gate driver circuits disposed in a peripheral region of display 14 (see, e.g., peripheral gate driver circuitry 34 in FIG. 2). It can be challenging to design gate driver circuits. Some gate driver circuits can be implemented using only p-type LTPS transistors. Such type of gate driver circuits that include only p-type LTPS transistors can include a large number of transistors that consume a substantial amount of power and can occupy a substantial amount of circuit area. It is within such context that the embodiments herein arise.

Figure 4:
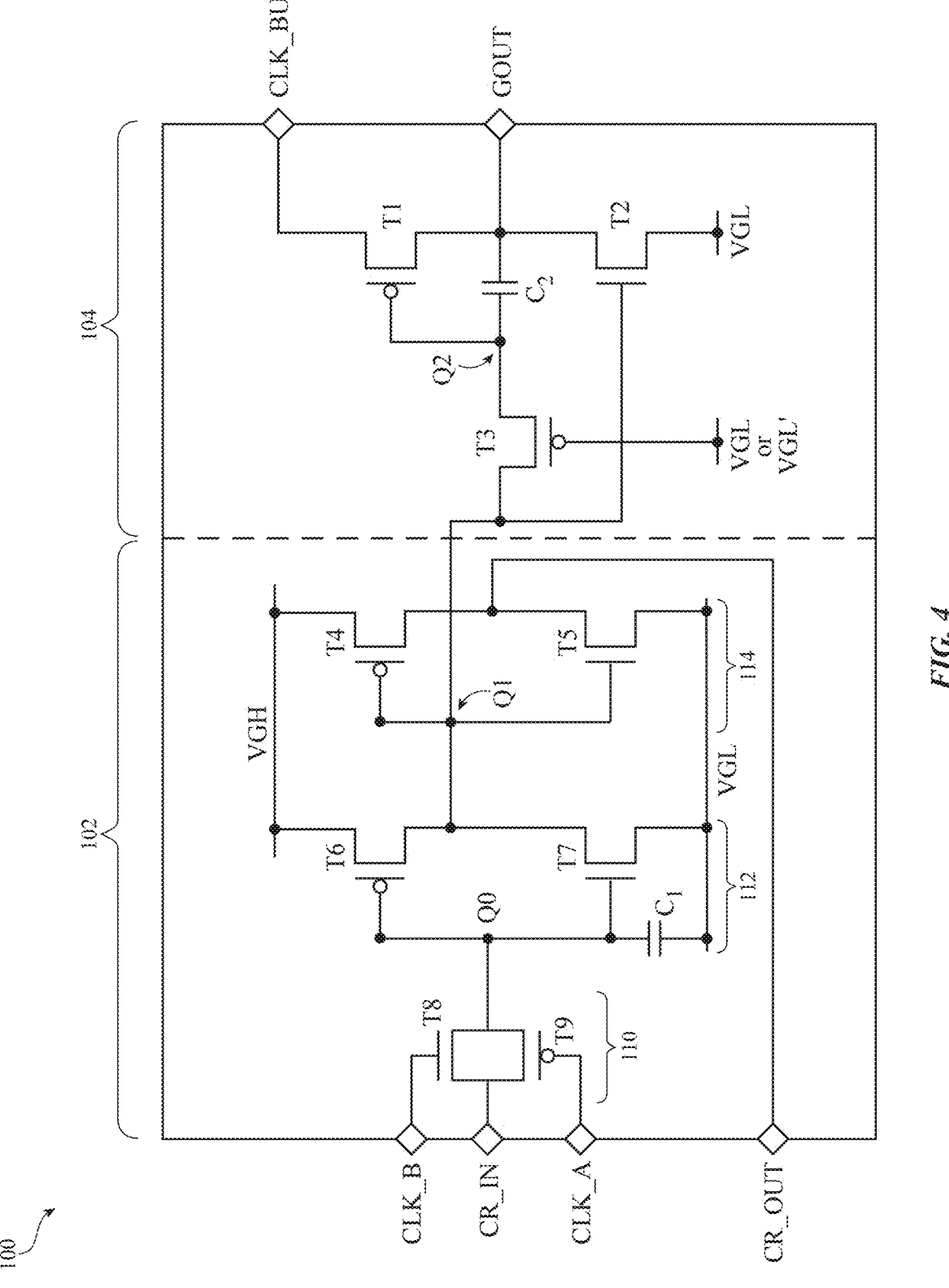
FIG. 4 is a circuit diagram of an illustrative gate driver circuit in accordance with some embodiments.

In accordance with an embodiment, FIG. 4 is a circuit diagram of an illustrative gate driver circuit 100 configured to generate a gate output signal GOUT for one or more transistors within display pixel 22. As an example, signal GOUT produced by gate driver circuit 100 can be conveyed to a data loading (programming) transistor within pixel 22. As shown in FIG. 4, gate driver 100 may include a logic subcircuit 102 and an output buffer subcircuit 104. The logic subcircuit 102 portion of gate driver 100 can receive a carry in (input) signal CR_IN from a gate driver in a preceding row and can output a carry out (output) signal CR_OUT to another gate driver in a succeeding row. Operated in this way, the logic subcircuit 102 is sometimes referred to and defined herein a "shift register" subcircuit.

Output buffer subcircuit 104 may include a first output buffer transistor T1 coupled in series with a second output buffer transistor T2. First output buffer transistor T1 may be a p-type silicon transistor having a first source-drain terminal configured to receive an output buffer clock signal CLK_BUF, a gate terminal coupled to node Q2, and a second source-drain terminal coupled to a gate driver output terminal on which gate output signal GOUT is produced. Second output buffer transistor T2 may be an n-type semiconducting oxide transistor having a drain terminal coupled to the gate driver output terminal, a source terminal coupled to a low power supply voltage VGL, and a gate terminal coupled to node Q1 within shift register subcircuit 102. Low power supply voltage VGL that is powering gate driver 100 may be less than the ground power supply voltage VSSEL powering each pixel 22. Supply voltage VGL is thus sometimes referred to as a gate driver (low) power supply voltage.

Output buffer subcircuit 104 may further include a capacitor C2 having a first terminal coupled to node Q2 and a second terminal coupled to the gate driver output terminal. Output buffer subcircuit 104 may further include a transistor such as p-type silicon transistor T3 having a first source-drain terminal coupled to node Q2, a second source-drain terminal coupled to node Q1 within shift register subcircuit 102, and gate terminal coupled to power supply voltage VGL. The series connection of p-type silicon transistor T1 and n-type semiconducting oxide transistor T2, along with transistor T3, are sometimes referred to collectively as a "complementary" thin-film inverting circuit for the output buffer subcircuit 104. The example of FIG. 4 in which p-type silicon transistor T3 has a gate terminal configured to receive power supply voltage VGL is illustrative. In other embodiments, the gate of transistor T3 can alternatively be configured to receive a different power supply voltage VGL' (e.g., a voltage VGL' that is less than or more negative than VGL). Biasing the p-type transistor T3 with a more negative VGL' can help improve the rise and fall times of the output buffer subcircuit 104 by increasing the source-to-gate voltage across transistor T1 and further enhance the bootstrap efficiency. Such T3 gate biasing scheme can optionally be applied to the embodiments of FIG. 7 and FIG. 8. Alternatively, transistor T3 can be a n-type transistor with a gate terminal connected to VGH.

Configured in this way, transistor T1, when activated, will pass the output buffer clock signal CLK_BUF to the gate driver output terminal (e.g., allowing CLK_BUF to modulate gate output signal GOUT). Capacitor C2 coupled across the gate and source-drain terminals of transistor T1 provides a bootstrap effect for the gate output signal GOUT. Transistor T2, when activated, can be configured to keep gate output signal GOUT low (e.g., during low refresh rate operations). Connecting the gate terminal of transistor T2 directly to node Q1 can be technically advantageous and beneficial to help stabilize the state of transistor T2 during transitions of signal CLK_BUF. Transistor T3 connected between nodes Q1 and Q2 can help provide further isolation between shift register subcircuit 102 and output buffer subcircuit 104 so that the carry out signal CR_OUT is immune from noise coupling from signal CLK_BUF. Transistor T3 is thus sometimes referred to as an isolation transistor.

Shift register subcircuit 102 may include transistors T4-T9 and capacitor C1. Transistors T4-T9 are therefore sometimes referred to as logic or shift register transistors. Transistor T4 may be a p-type silicon transistor having a source terminal coupled to high power supply voltage VGH, a gate terminal coupled to node Q1, and a drain terminal on which carry out signal CR_OUT is produced. High power supply voltage VGH that is powering gate driver 100 may be greater than the positive power supply voltage VDDEL powering each pixel 22. Supply voltage VGH is thus sometimes referred to as a gate driver (high) power supply voltage. Supply voltage VGL can be provided on a first (low) power supply line, whereas supply voltage VGH can be provided on a second (high) power supply line. Transistor T5 may be a semiconducting oxide transistor having a drain terminal coupled to the drain terminal of transistor T4, a source terminal coupled to low gate driver power supply voltage VGL, and a gate terminal coupled to node Q1. P-type transistor T4 and n-type transistor T5 coupled together in series between gate driver power supply voltages VGH and VGL in this way are sometimes referred to collectively as a "complementary" thin-film inverter 114 within shift register subcircuit 102. The term "complementary" can be defined herein as a circuit that includes both n-type and p-type transistors. Inverter 114 is thus sometimes referred to as a complementary inverter.

Transistor T6 may be a p-type silicon transistor having a source terminal coupled to high power supply voltage VGH, a gate terminal coupled to node Q0, and a drain terminal coupled to node Q1. Transistor T7 may be a semiconducting oxide transistor having a drain terminal coupled to the drain terminal of transistor T6, a source terminal coupled to low gate driver power supply voltage VGL, and a gate terminal coupled to node Q0. Capacitor C1 may have a first terminal coupled to node Q0 and a second terminal coupled to VGL. Capacitor C1 is sometimes referred to as a shunt capacitor coupled at the gate of transistor T7. P-type transistor T6 and n-type transistor T7 coupled together in series between gate driver power supply voltages VGH and VGL in this way are sometimes referred to collectively as a "complementary" thin-film inverter 112 within shift register subcircuit 102. Inverter 112 is thus sometimes referred to as a complementary inverter.

Transistor T8 may be a semiconducting oxide transistor having a first source-drain terminal coupled to node Q0, a second source-drain terminal configured to receive carry in signal CR_IN from another gate driver circuit in the chain, and a gate terminal configured to receive clock signal CLK_B. Transistor T9 may be a p-type silicon transistor having a first source-drain terminal coupled to node Q0, a second source-drain terminal configured to receive carry in signal CR_IN from another gate driver circuit in the chain, and a gate terminal configured to receive clock signal CLK_A. Clock signals CLK_A and CLK_B are sometimes referred to as logic (shift register) clock signals. N-type transistor T8 and p-type transistor T9 coupled together in parallel in this way are sometimes referred to collectively as a transmission gate 110, which is also considered a "complementary" signal transmission circuit.

Shift register subcircuit 102 that includes complementary transmission gate 110 as a first stage, complementary inverter 112 as a second stage, and complementary inverter 114 as a third stage can thus sometimes be referred to herein as a "complementary" shift register subcircuit 102. Transmission gate 110 can be configured to ensure an efficient passing of signal CR_IN into shift register subcircuit 102 without any threshold voltage drop. Capacitor C1 at node Q0 can be configured to stabilize the voltage at node Q0, which can enhance the signal hold-ability of shift register subcircuit 102 while reducing unwanted fluctuations. Inverter 112 can receive the voltage at node Q0 and output a corresponding inverted voltage at node Q1, ensuring accurate logic level transitions needed for dynamic operations. Inverter 114 can be configured as a complementary buffer for the carry out signal CR_OUT, amplifying and protecting CR_OUT from unwanted noise (e.g., noise from the output buffer subcircuit 104) to ensure a clean output waveform. Output buffer subcircuit 104 is directly coupled to node Q1 (e.g., the input of inverter 114), so small voltage perturbations will not affect the carry out signal CR_OUT.

Gate driver circuit 100 of the type shown in FIG. 4 is technically advantageous and beneficial by providing fast GOUT rise and fall times with relatively low power consumption and small area footprint. The gate driver 100 of FIG. 4 includes only nine transistors T1-T9 and two capacitors C1 and C2. Capacitors C1 and C2 are optional and can be omitted to further reduce area if the parasitic capacitance at nodes Q0 and Q2 are sufficient. In particular, capacitor C2 can be individually omitted to improve the rise time of output buffer subcircuit 104, if the bootstrap from the parasitic gate capacitance of transistor T1 is sufficient. The use of complementary circuits 110, 112, 114, and the inverting circuit of T1 and T2 allows for low power and low impedance operation. The use of complementary buffer stage 114 and isolation transistor T3 can provide noise immunity between the carry out signal CR_OUT and the gate output signal GOUT. The use of n-type transistors such as semiconducting oxide transistor T8, T7, and/or T5 within shift register subcircuit 102 can also help provide stronger hold-ability of low voltage signals. Gate driver circuit 100 of the type shown in FIG. 4 also requires fewer clock phases.

Figure 5:
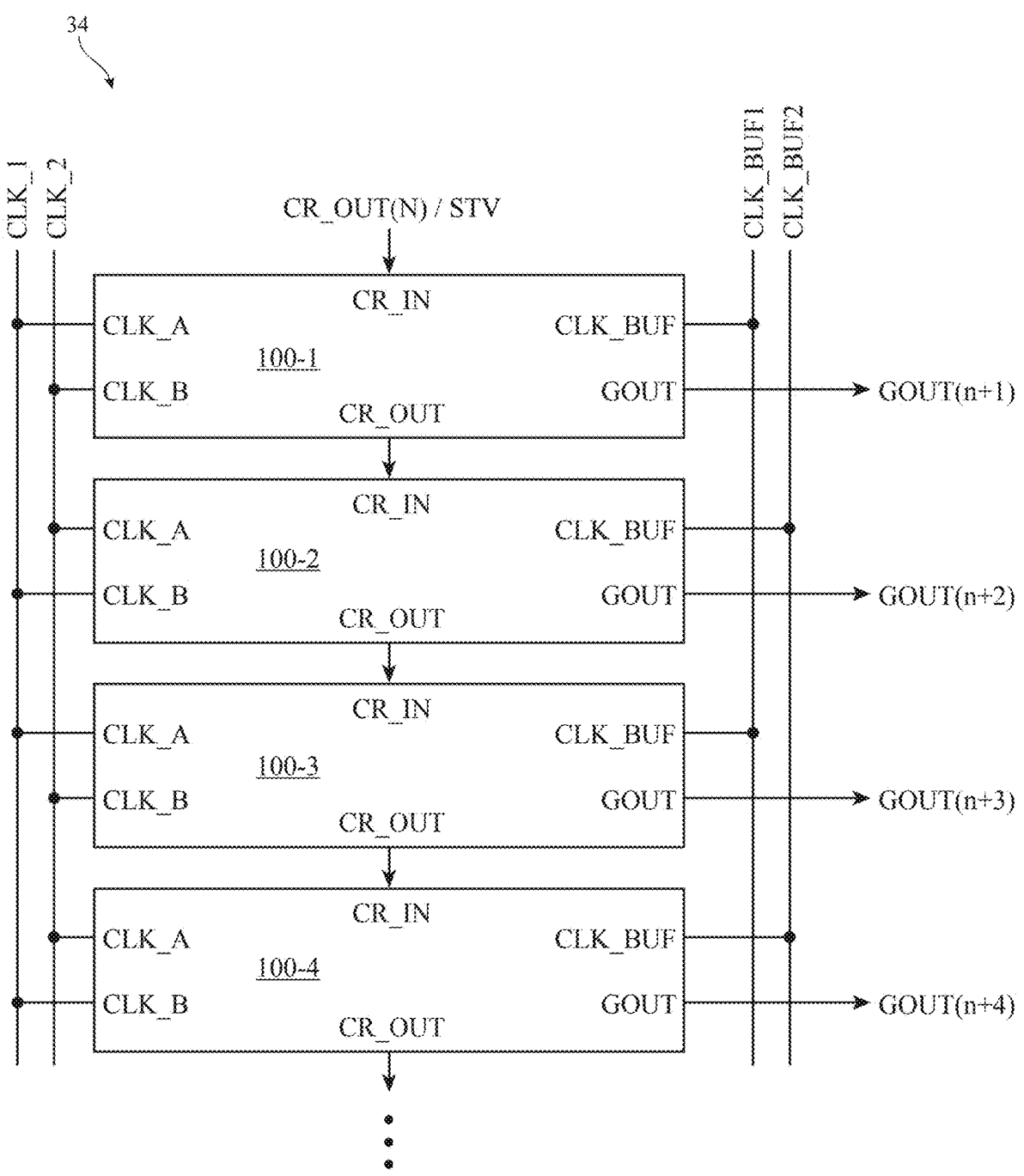
FIG. 5 is a diagram showing a chain of gate driver circuits of the type shown in FIG. 4 in accordance with some embodiments.

FIG. 5 is a diagram showing a chain of gate driver circuits 100 of the type shown in FIG. 4 in accordance with some embodiments. As shown in FIG. 5, gate driver circuitry 34 may include a chain of gate drivers 100 such as gate drivers 100-1, 100-2, 100-3, and 100-4. Although only four gate drivers 100 are shown in FIG. 5, gate driver circuitry 34 may include hundreds or thousands of gate drivers 100 connected in a chain. Gate driver 100-1 can be configured to generate a first gate output (scan) signal GOUT (n+1) that is conveyed to display pixels 22 along a first row (e.g., to data loading transistors in pixels 22 of the first row). Gate driver 100-2 can be configured to generate a second gate output (scan) signal GOUT (n+2) that is conveyed to display pixels 22 along a second row (e.g., to data loading transistors in pixels 22 of the second row). Gate driver 100-3 can be configured to generate a third gate output (scan) signal GOUT (n+3) that is conveyed to display pixels 22 along a third row (e.g., to data loading transistors in pixels 22 of the third row). Gate driver 100-4 can be configured to generate a fourth gate output (scan) signal GOUT (n+4) that is conveyed to display pixels 22 along a fourth row (e.g., to data loading transistors in pixels 22 of the fourth row).

In the example of FIG. 5, each gate driver 40 may receive a carry in signal from a gate driver one row above and may thus generate a carry out signal that is fed forward to a gate driver one row below. For example, gate driver 100-1 in row (n+1) may receive a carry in signal from a preceding row or can receive a start pulse signal STV if gate driver 100-1 is one of the leading gate drivers in the chain and may output a carry out signal to row (n+2). As another example, gate driver 100-3 in row (n+3) may receive a carry in signal from row (n+2) and may output a carry out signal to row (n+4). This is merely illustrative. In general, gate driver 100 may receive a carry in signal from a gate driver in any preceding row (e.g., from one row above, two rows above, three rows above, four rows above, or more than four rows above) and may output a carry out signal to another gate driver in any succeeding row (e.g., to one row below, two rows below, three rows below, four rows below, or more than four rows below).

Gate driver circuitry 34 can be controlled using only two shift register clock signals CLK_1 and CLK_2. The first shift register clock signal CLK_1 can be fed to the CLK_A port of the odd gate drivers in the chain (e.g., gate drivers 100-1, 100-3, and so on) and to the CLK_B port of the even gate drivers in the chain (e.g., gate drivers 100-2, 100-4, and so on). The second shift register clock signal CLK_2 can be fed to the CLK_B port of the odd gate drivers in the chain and to the CLK_A port of the even gate drivers in the chain. At the other end, gate driver circuitry 34 can also be controlled using only two different output buffer clock signals CLK_BUF1 and CLK_BUF2. The first output buffer clock signal CLK_BUF1 can be fed to the CLK_BUF port of the odd gate drivers in the chain, whereas the second output buffer clock signal CLK_BUF2 can be fed to the CLK_BUF port of the even gate drivers in the chain. Group of four gate drivers circuits 100 can be repeated down the chain based on the arrangement shown in FIG. 5. In other words, gate driver circuitry 34 can be controlled using only four clock signals (e.g., two shift register clock signals CLK_1 and CLK_2 and two output buffer clock signals CLK_BUF1 and CLK_BUF2).

Figure 6:
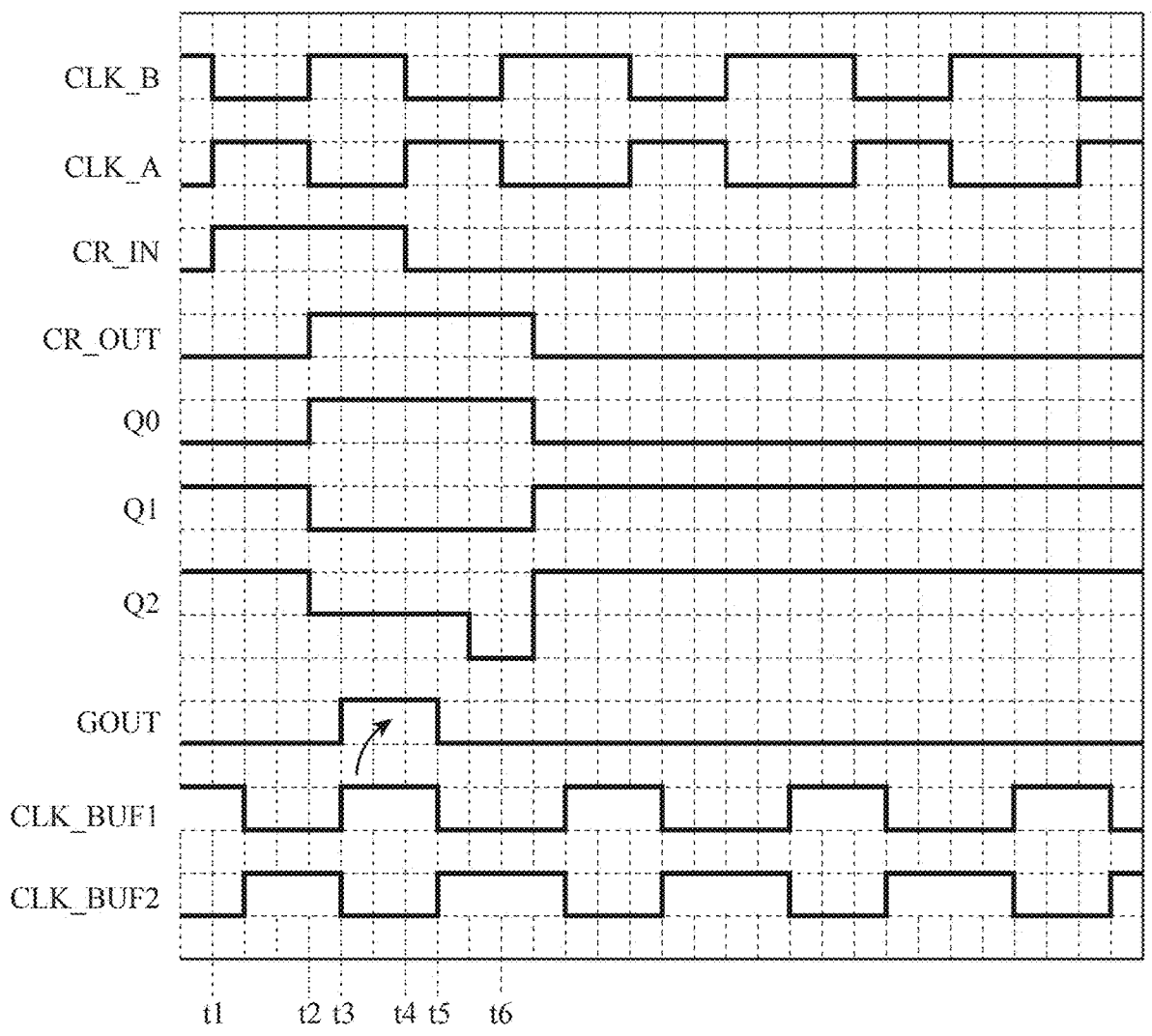
FIG. 6 is a timing diagram showing the behavior of relevant signals involved in operating the gate driver circuit of FIG. 4 in accordance with some embodiments.

FIG. 6 is a timing diagram illustrating the operation of gate driver circuit 100 of the type described in connection with FIGS. 4-5. As shown in FIG. 6, clock signal CLK_B may be a delayed version of clock signal CLK_A (or vice versa). In particular, CLK_B can be an inverted version of CLK_A. Similarly, clock signal CLK_BUF2 may be a delayed version of clock signal CLK_BUF1. As an example, CLK_BUF2 can be an inverted version of CLK_BUF1. The shift register clock signals CLK_A and CLK_B may have the same pulse width as the output buffer clock signals CLK_BUF1 and CLK_BUF2. This need not be the case. If desired, the shift register clock signals CLK_A and CLK_B can optionally have a wider pulse width than the output buffer clock signals CLK_BUF1 and CLK_BUF2.

At time t1, the carry in signal CR_IN from the prior row is pulsed high (from time t1 to t4). At time t2, signal CLK_B is pulsed high while signal CLK_A is pulsed low, which collectively activate transmission gate 110 (see FIG. 4). When transmission gate 110 is activated, signal CR_IN can be passed to internal node Q0. Thus, at time t2, node Q0 is driven high in accordance with the high CR_IN signal. When node Q0 is driven high, inverter 112 will then drive node Q1 low. Inverter 114 will generate a carry out signal CR_OUT that is inverted with respect to the voltage at node Q1. The behavior of node Q2 is related to node Q1 and transistor T3 operation. Before time t2, transistor T3 is activated because the voltage at node Q1 is greater than the voltage VGL at its gate, causing node Q2 to follow node Q1. As the voltage on node Q1 toggles from high to low, approaching (VGL-VTH), transistor T3 turns off when its gate-to-source voltage VGS equals VTH, where VTH represents the threshold voltage of transistor T3. At this point, node Q2 is held at (VGL-VTH) until CLK_BUF1 toggles. Node Q1 will further drop to VGL, but node Q2 remains unaffected, as transistor T3 is deactivated, isolating node Q2 from node Q1.

At time t3, signal CLK_BUF1 is pulsed high. Since node Q2 is low at this time, output buffer transistor T1 is activated, so the CLK_BUF1 pulse is passed through to the GOUT signal. This may also generate an upward noise peak at node Q2 due to the coupling from signal CLK_BUF1. At time t5, signal CLK_BUF1 is driven low, which will cause the GOUT signal to be driven low. When signal GOUT is driven low, bootstrap capacitor C2 will pull node Q2 to an even lower voltage level such as to (2VGL-VGH-VTH) at time t5. At time t6, signals CLK_B and CLK_A are driven high and low, respectively, which again activate transmission gate 110. Since signal CR_IN is low at this time, this low voltage will pass through transmission gate 110 to node Q0 (e.g., driving node Q0 low). This, in turn, causes inverter 112 to drive node Q1 high, activating transistor T3, which then causes node Q2 to be driven back high through T3. The timing of FIG. 6 is exemplary and can be adapted for remaining gate drivers in the chain in succession.

Figure 7:
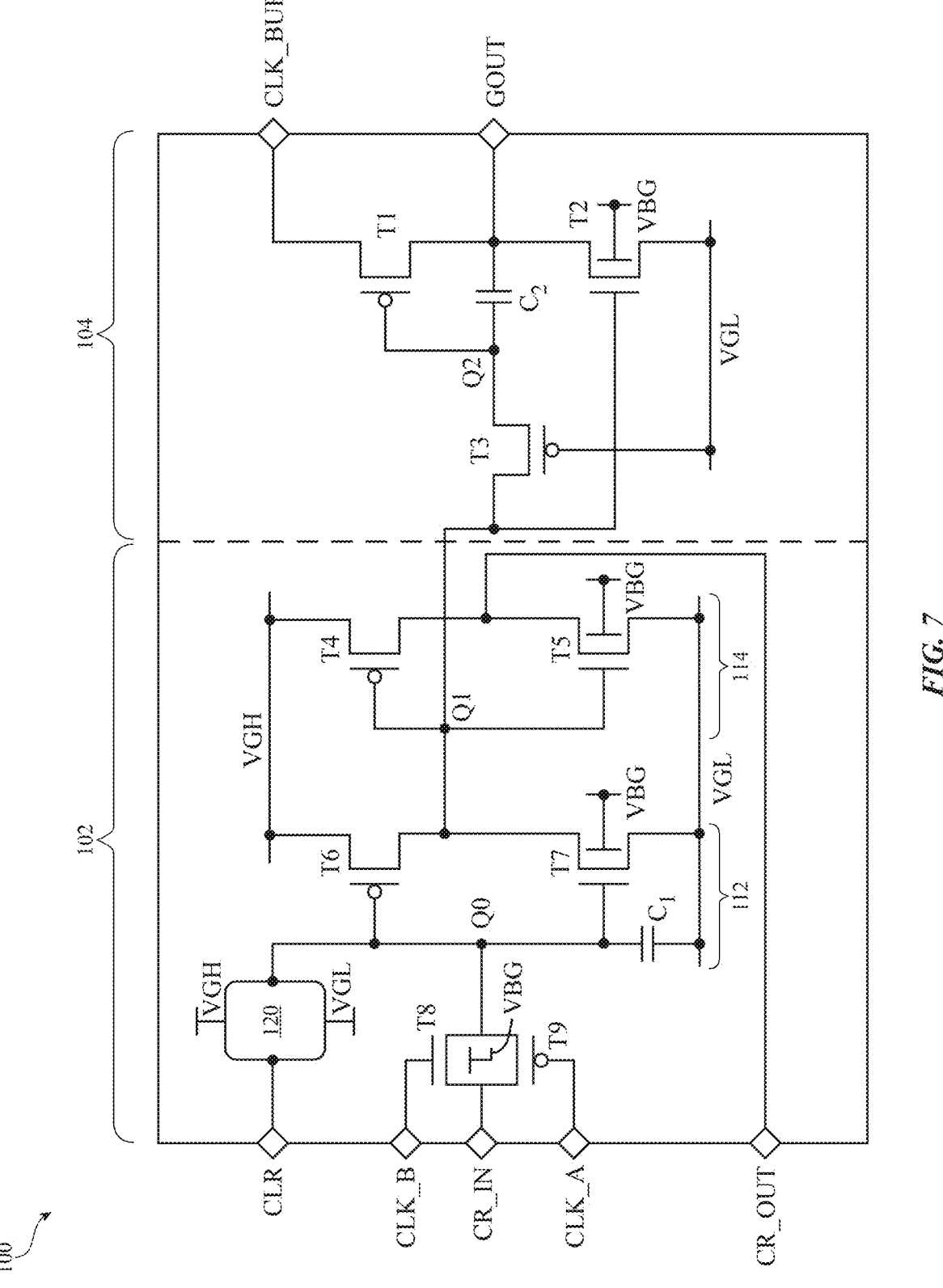
FIG. 7 is a circuit diagram showing another implementation of an illustrative gate driver circuit in accordance with some embodiments.

The embodiment of gate driver circuit 100 shown in FIG. 4 is illustrative. FIG. 7 illustrates another embodiment of gate driver circuit 100 in which the semiconductor oxide transistors are provided with a back gate connection. In a thin-film display stackup, a thin-film transistor can sometimes be provided with two gate terminals. For example, a semiconducting oxide transistor can include a front gate terminal formed from a conductive layer above the semiconducting oxide layer and is therefore sometimes referred to as the "top" gate conductor. On the other hand, the semiconducting oxide transistor can include a back gate terminal formed from a conductive layer below the semiconductive oxide layer and is therefore sometimes referred to as the "bottom" gate conductor.

In the example of FIG. 7, semiconducting oxide transistors T2, T5, T7, and T8 can have back gate terminals configured to receive a back gate voltage VBG. The back gate voltage VBG can be tuned to adjust the threshold voltages of the semiconducting oxide transistors, which can be technically advantageous to help mitigate risks associated with voltage fluctuations while enhancing overall device reliability. For example, back gate voltage VBG can be tuned so that the threshold voltages of transistors T2, T5, T7, and T8 are more positive. In some embodiments, the back gate voltage VBG for transistors T2, T5, T7, and T8 can all be at the same voltage level. In other embodiments, the back gate voltage VBG for transistors T2, T5, T7, and T8 can be adjusted to two or more different voltage levels. If desired, the back gate voltage can optionally be set to VGL' (e.g., a voltage level different or lower than VGL).

If desired, gate driver circuit 100 of FIG. 7 can further include a discharge circuit such as discharge circuit 120. Discharge circuit 120 may include one or more transistors and one or more capacitors. Discharge circuit 120 can be controlled by a clear signal CLR. When the clear signal CLR is asserted, discharge charge circuit 120 can be configured to pull node Q0 low or high towards VGL or VGH per pixel discharging or precharging requirements. Signal CLR may be a global clearing signal. Operated in this way, discharge circuit 120 can thus facilitate complete discharging of one or more nodes within gate driver 100 during power on and power off sequences, which can be technically advantageous and beneficial to ensure clean transitions while preventing residual electrical charge that would otherwise negatively affect startup operations. If desired, capacitors C1 and C2 can optionally be omitted to further optimize for area and cost.

Figure 8:
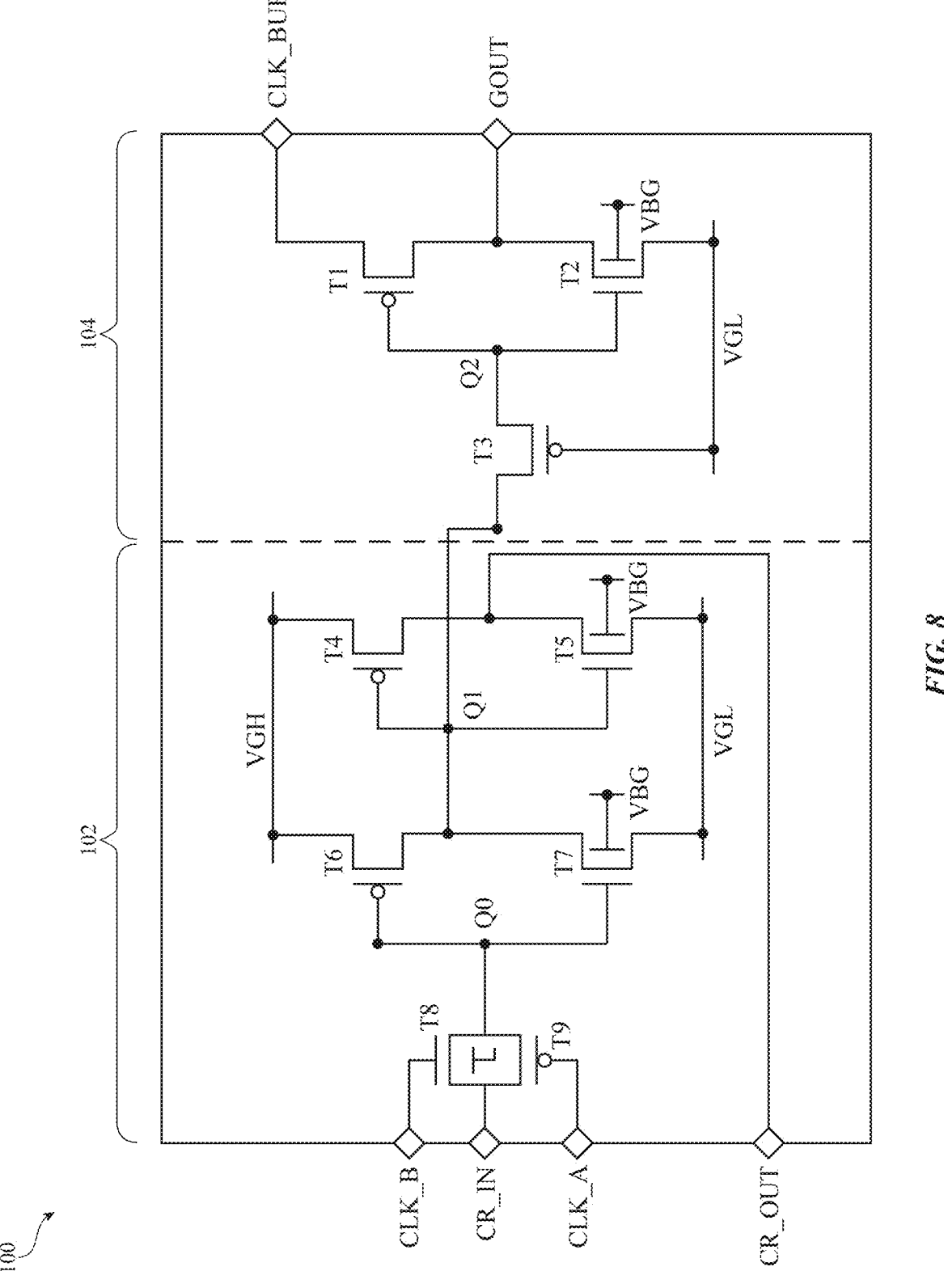
FIG. 8 is a circuit diagram showing another implementation of an illustrative gate driver circuit in accordance with some embodiments.

The embodiments of FIGS. 4 and 7 in which the gate terminal of the second output buffer transistor T2 is coupled to node Q1 with shift register 102 are exemplary. FIG. 8 shows another embodiment of gate driver circuit 100 in which the gate terminal of the second output buffer transistor is directly coupled to node Q2 (e.g., to the gate terminal of transistor T1). Such connection can provide a simpler local routing and layout for the output buffer subcircuit 104.

The foregoing is merely illustrative and various modifications can be made to the described embodiments. The foregoing embodiments may be implemented individually or in any combination.

What is claimed is:

1. A gate driver circuit comprising:
a first complementary inverter configured to receive a carry in signal;
a second complementary inverter having an input coupled to the first complementary inverter and having an output at which a carry out signal is produced; and
an output buffer subcircuit coupled to the input of the second complementary inverter and configured to produce a gate output signal that is conveyed to a plurality of corresponding display pixels, wherein:
the output buffer subcircuit comprises a first output buffer transistor coupled in series with a second output buffer transistor;
the first output buffer transistor has a first source-drain terminal configured to receive an output buffer clock signal and a second source-drain terminal coupled to a gate output terminal of the gate driver circuit; and
the second output buffer transistor has a first source-drain terminal coupled to the gate output terminal, a second source-drain terminal coupled to a first power supply line, and a gate terminal coupled to the input of the second complementary inverter.

2. The gate driver circuit of claim 1, wherein the second output buffer transistor has a back gate terminal configured to receive a back gate voltage.

3. The gate driver circuit of claim 1, further comprising:
an isolation transistor having a first source-drain terminal coupled to a gate terminal of the first output buffer transistor, a second source-drain terminal coupled to the input of the second complementary inverter, and a gate terminal coupled to the first power supply line.

4. The gate driver circuit of claim 3, wherein:
the first output buffer transistor comprises a first p-type silicon transistor;
the second output buffer transistor comprises a semiconducting oxide transistor; and
the isolation transistor comprises a second p-type silicon transistor.

5. The gate driver circuit of claim 3, further comprising:
a bootstrap capacitor coupled across the gate terminal of the first output buffer transistor and the gate output terminal.

6. The gate driver circuit of claim 1, wherein the first complementary inverter comprises:
a semiconducting oxide transistor having a source terminal coupled to a first power supply line, a drain terminal coupled to the input of the second complementary inverter, and a gate terminal; and a p-type silicon transistor having a source terminal coupled to a second power supply line different than the first power supply line, a drain terminal coupled to the input of the second complementary inverter, and a gate terminal coupled to the gate terminal of the semiconducting oxide transistor.

7. The gate driver circuit of claim 6, wherein the semiconducting oxide transistor has a back gate terminal configured to receive a back gate voltage.

8. The gate driver circuit of claim 6, further comprising:

a capacitor coupled across the gate terminal of the semiconducting oxide transistor and the first power supply line.

9. The gate driver circuit of claim 1, wherein the second complementary inverter comprises:

a semiconducting oxide transistor having a source terminal coupled to a first power supply line and having a gate terminal; and a p-type silicon transistor having a source terminal coupled to a second power supply line different than the first power supply line, a drain terminal coupled to the semiconducting oxide transistor, and a gate terminal coupled to the gate terminal of the semiconducting oxide transistor.

10. The gate driver circuit of claim 9, wherein the semiconducting oxide transistor has a back gate terminal configured to receive a back gate voltage.

11. The gate driver circuit of claim 1, further comprising:

a transmission gate configured to receive the carry in signal and coupled to an input of the first complementary inverter.

12. The gate driver circuit of claim 11, wherein the transmission gate comprises:

a p-type silicon transistor configured to receive a first shift register clock signal; and a semiconducting oxide transistor configured to receive a second shift register clock signal different than the first shift register clock signal.

13. The gate driver circuit of claim 1, further comprising:

a discharge circuit configured to receive a clear signal and coupled to an input of the first complementary inverter.

14. Gate driver circuitry comprising:

a first gate driver circuit having a first clock terminal configured to receive a first shift register clock signal, a second clock terminal configured to receive a second shift register clock signal different than the first shift register clock signal, and a third clock terminal configured to receive a first output buffer clock signal, wherein the first gate driver circuit further comprises:

a first p-type silicon transistor having a source-drain terminal configured to receive the first output buffer clock signal;

a second semiconducting oxide transistor coupled in series with the first p-type silicon transistor;

a third p-type silicon transistor coupled between a gate terminal of the first p-type silicon transistor and a gate terminal of the second semiconducting oxide transistor;

a first inverter configured to receive a carry in signal; and a second inverter coupled to an output of the first inverter and configured to generate a corresponding carry out signal, wherein the third p-type silicon transistor is coupled to an input of the second inverter; and a second gate driver circuit having a first clock terminal configured to receive the second shift register clock signal, a second clock terminal configured to receive the first shift register clock signal, and a third clock terminal configured to receive a second output buffer clock signal different than the first output buffer clock signal.

15. The gate driver circuitry of claim 14, further comprising:

a third gate driver circuit having a first clock terminal configured to receive the first shift register clock signal, a second clock terminal configured to receive the second shift register clock signal, and a third clock terminal configured to receive the first output buffer clock signal; and a fourth gate driver circuit having a first clock terminal configured to receive the second shift register clock signal, a second clock terminal configured to receive the first shift register clock signal, and a third clock terminal configured to receive the second output buffer clock signal.

16. The gate driver circuitry of claim 15, wherein:

the second gate driver circuit is configured to receive a carry out signal from the first gate driver circuit;

the third gate driver circuit is configured to receive a carry out signal from the second gate driver circuit; and the fourth gate driver circuit is configured to receive a carry out signal from the third gate driver circuit.

17. The gate driver circuitry of claim 15, wherein:

the first gate driver circuit is configured to generate a first scan signal that is conveyed to a plurality of data loading transistors in display pixels along a first row;

the second gate driver circuit is configured to generate a second scan signal that is conveyed to a plurality of data loading transistors in display pixels along a second row adjacent to the first row;

the third gate driver circuit is configured to generate a third scan signal that is conveyed to a plurality of data loading transistors in display pixels along a third row adjacent to the second row; and the fourth gate driver circuit is configured to generate a fourth scan signal that is conveyed to a plurality of data loading transistors in display pixels along a fourth row adjacent to the third row.

18. A gate driver circuit comprising:

a first p-type silicon transistor having a source-drain terminal configured to receive an output buffer clock signal;

a second semiconducting oxide transistor coupled in series with the first p-type silicon transistor;

a third p-type silicon transistor having a first source-drain terminal coupled to a gate terminal of the first p-type silicon transistor and having a second source-drain terminal coupled to a gate terminal of the second semiconducting oxide transistor;

a fourth p-type silicon transistor having a source terminal coupled to a first power supply line, a drain terminal on which a carry out signal is produced, and a gate terminal coupled to the second source-drain terminal of the third p-type silicon transistor;

a fifth semiconducting oxide transistor having a drain terminal coupled to the drain terminal of the fourth p-type silicon transistor, a source terminal coupled to a second power supply line, and a gate terminal shorted to the gate terminal of the fourth p-type silicon transistor;

a sixth p-type silicon transistor having a source terminal coupled to the first power supply line, a drain terminal coupled to the gate terminal of the fourth p-type silicon transistor, and a gate terminal;

a seventh semiconducting oxide transistor having a drain terminal coupled to the drain terminal of the sixth p-type silicon transistor, a source terminal coupled to the second power supply line, and a gate terminal coupled to the gate terminal of the sixth p-type silicon transistor;

an eighth semiconducting oxide transistor having a first source-drain terminal coupled to the gate terminal of the sixth p-type silicon transistor, a second source-drain terminal configured to receive a carry in signal, and a gate terminal configured to receive a first shift register clock signal; and a ninth p-type silicon transistor having a first source-drain terminal coupled to the gate terminal of the sixth p-type silicon transistor, a second source-drain terminal configured to receive the carry in signal, and a gate terminal configured to receive a second shift register clock signal different than the first shift register clock signal.

\* \* \* \* \*